(12) United States Patent
Anderson

(10) Patent No.: US 7,615,386 B2
(45) Date of Patent: Nov. 10, 2009

(54) THICK OXIDE FILM FOR WAFER BACKSIDE PRIOR TO METALIZATION LOOP

(75) Inventor: Nhan Hanh Anderson, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 419 days.

(21) Appl. No.: 11/709,492

(22) Filed: Feb. 22, 2007

(65) Prior Publication Data

US 2008/0160647 A1    Jul. 3, 2008

Related U.S. Application Data

(60) Provisional application No. 60/877,782, filed on Dec. 29, 2006.

(51) Int. Cl.
*H01L 21/31* (2006.01)

(52) U.S. Cl. ............... 438/6; 438/692; 438/778; 257/E21.001

(58) Field of Classification Search ............ 438/6, 438/778, 692
See application file for complete search history.

(56) References Cited

U.S. PATENT DOCUMENTS

2004/0063263 A1* 4/2004 Suzuki et al. ............ 438/197

* cited by examiner

*Primary Examiner*—Savitri Mulpuri
(74) *Attorney, Agent, or Firm*—Warren L. Franz; Wade J. Brady, III; Frederick J. Telecky, Jr.

(57) ABSTRACT

A method for reducing wafer backside large particle contamination, comprising: performing front end of line processing of a memory device, depositing a thick oxide on the wafer backside so that at least pre-selected oxide thickness remains after back end of line processing is complete and performing the back end of line processing of the memory device.

18 Claims, 17 Drawing Sheets

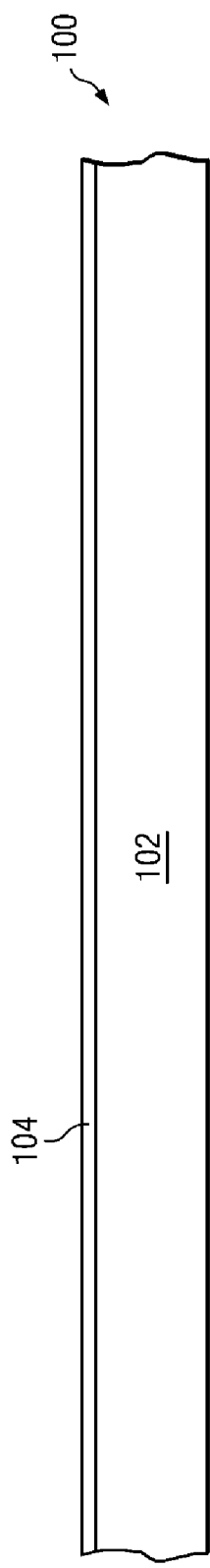
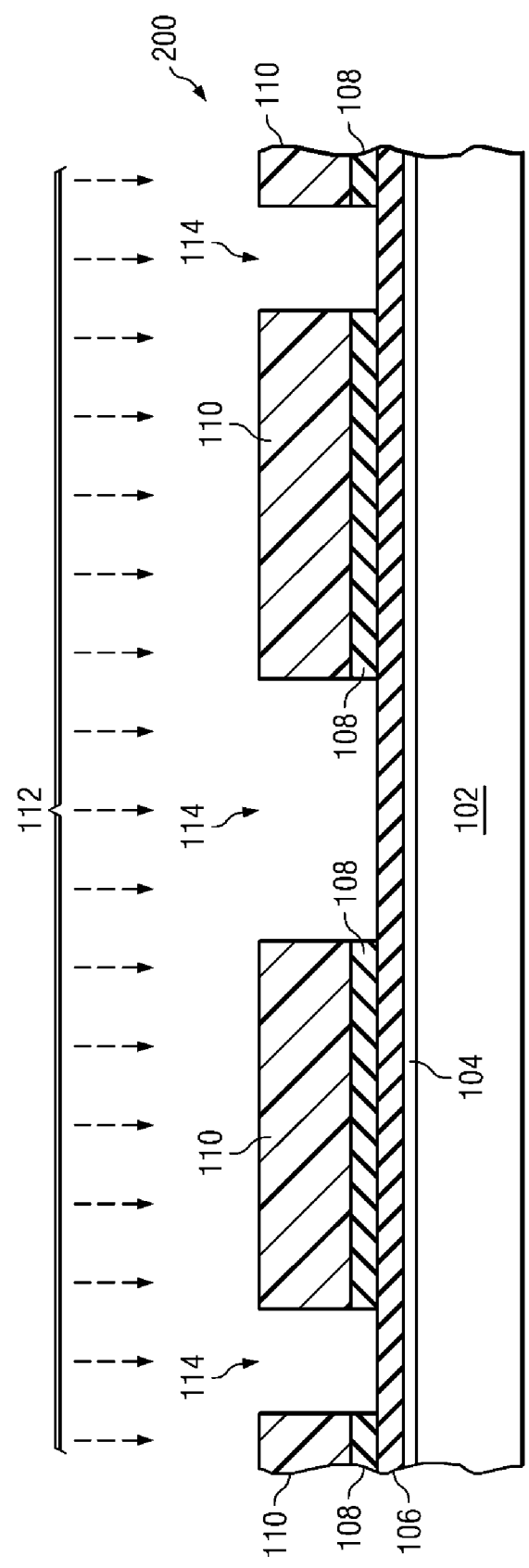

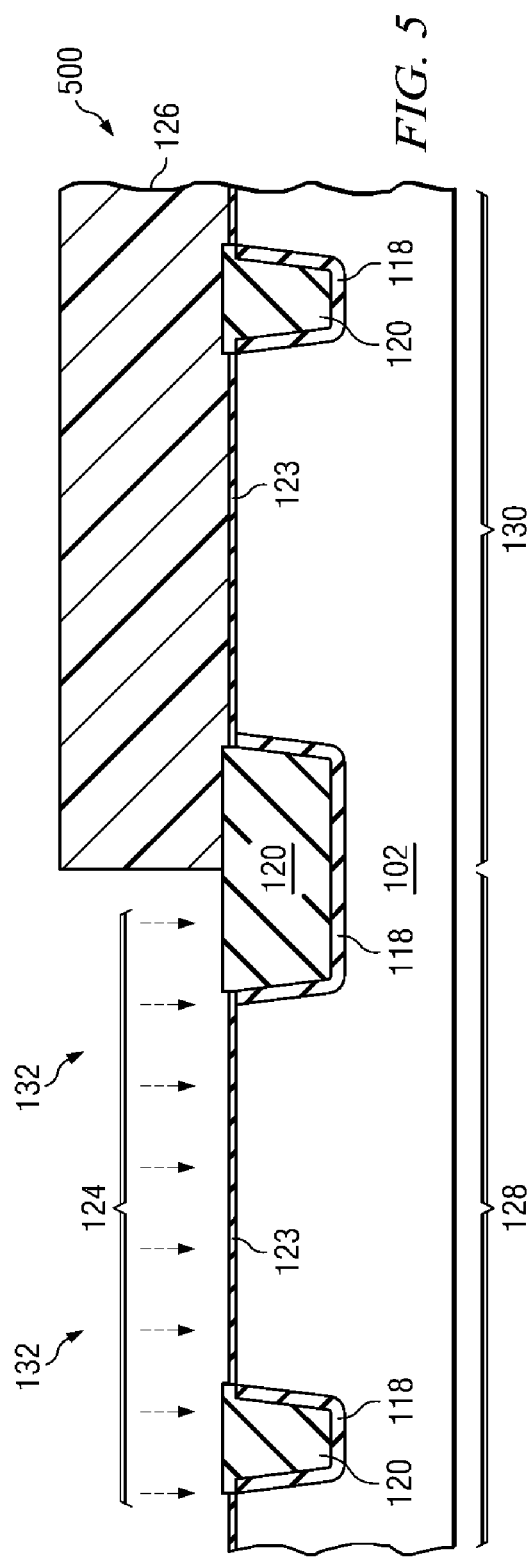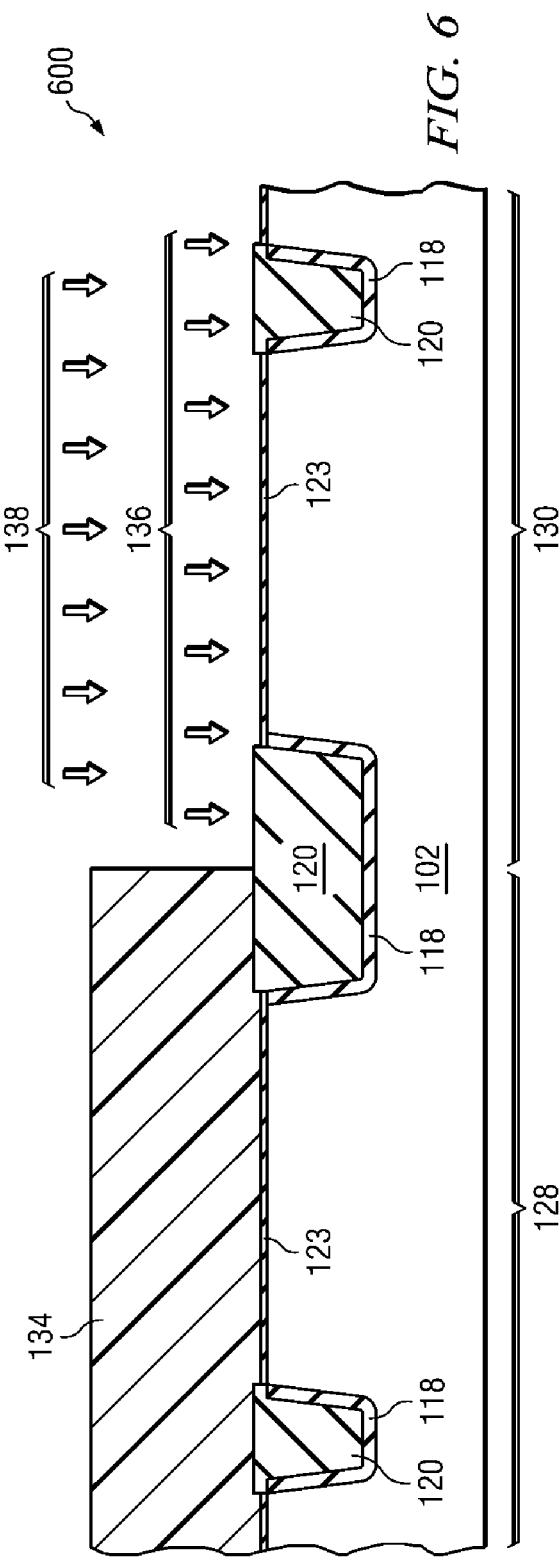

THICK OXIDE FILM FOR WAFER BACKSIDE PRIOR TO METALIZATION LOOP

REFERENCE TO RELATED APPLICATIONS

This application claims priority to Ser. No. 60/877,782 filed Dec. 29, 2006, which is entitled "Thick Oxide Film for Wafer Backside Prior to Metalization Loop".

FIELD OF THE INVENTION

The present invention relates generally to substrate processing and more particularly to an improved method for reducing wafer backside large particle contamination.

BACKGROUND OF THE INVENTION

Integrated circuit (IC) fabrication on a silicon wafer can be thought of as "front end of the line" processing (FEOL) and "back end of the line" processing (BEOL). FEOL processing is frequently the fabrication of various devices on the topside layer of the wafer and BEOL is normally perceived as electrically interconnecting the various devices created in the FEOL processing. Integrated circuits are particularly susceptible to contaminants both during FEOL and BEOL and therefore the wafer goes through numerous cleaning processes during the fabrication process. The contamination can involve large particles that are embedded on the wafer at some level or degree of adhesion. Silicon (Si), silicon dioxide ($SiO_2$) surfaces, and the like are typically cleaned in the FEOL. In contrast, metal layers are present on the wafers during BEOL, and therefore different cleaners of a more limited nature than FEOL cleaners are necessary for BEOL cleaning. The objective of any cleaning process is to remove particles without damaging the wafer.

Lithography is a semiconductor fabrication process that normally involves transferring an electronic pattern to a photoresist on the surface of a semiconductor substrate. Frontside surface contaminants and defects on wafers have been the primary focus of semiconductor manufacturers, whereas little consideration has been focused on backside wafer contaminants. Based on new technology nodes, semiconductor manufacturers have begun centering attention on contaminants located on the backside of the substrate that can have a significant impact on wafer scrap rates, rework, yield, parametric outliers, and the like. Backside cross contamination, for example, can result in zero yield in portions of the wafer due to opens or shorts from pattern defocus, increased rework, decreased throughput, lower wafer yields, and the like.

Potential sources of contamination are poor maintenance of the process line, poor tool design, poor process setup, contamination from incoming wafers, contaminated handling tools, moving wafers from tool to tool, contaminants picked up in a cleaning process, and the like One of the conventional strategies to resolve backside contamination is to perform additional cleaning steps for each wafer patterning loop that are dedicated mainly to cleaning the backside of the wafer. Backside contamination and large particles, in particular, can contribute to lithographic issues to be discussed infra, by causing photolithography "hot spots", distorting wafer flatness during exposure, and the like. If hot spots are detected during various process steps, for example, wafers have to be reworked at great expense or the wafers can be scrapped which results in a significant reduction in yield.

In conventional memory device fabrication, the wafer backside is often coated with a nitride film. However, nitride is not advantageous with current BEOL cleans that are directed to clean oxide films on the front surface of the wafer. Use of nitride film is not an optimal approach as the majority of industry cleaning processes do not address nitride films. In addition, nitride has a greater affinity for particle adhesion than does oxide.

Therefore in integrated circuit technology and other applications there remains a need to reduce wafer backside contaminants in order to ensure high quality of wafers, high yields of wafers and the like.

SUMMARY OF THE INVENTION

The present invention is directed to a method for depositing a thick oxide film on the backside of wafers in order to reduce large particle contamination, hot spots, and the like, and to increase wafer and memory device yields, quality, etc.

According to one aspect of the invention, one method of depositing an oxide film on the backside of wafers comprises applying an oxide film that is thick enough so that a minimum thickness of the oxide remains on the backside of the wafer after all processing steps have been completed for the memory device. According to another aspect of the invention, the oxide will last through multiple levels of chemical mechanical polishing (CMP) cleans, BEOL cleans, cleans that etch the oxide, and the like.

According to yet another aspect of the invention, the inventor recognized that by applying a thick oxide film to the backside of the wafer, prior to the metallization loop, the method can optimize the removal of backside contamination with current cleans that are already in the process line without having to create additional backside clean process steps or by adding only a minimal number of additional cleaning steps or operations.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a side view illustrating a substrate, according to one aspect of the present invention;

FIG. 2 is a side view of the substrate, shown in FIG. 1, where the substrate is patterned with photoresist, according to an aspect of the invention;

FIG. 5 is a side view, illustrating an implantation process, according to one aspect of the present invention;

FIGS. 6-18 are cross-sectional illustrations of partial memory devices formed according to one or more aspects of the present invention;

DETAILED DESCRIPTION OF THE INVENTION

Figure 3:
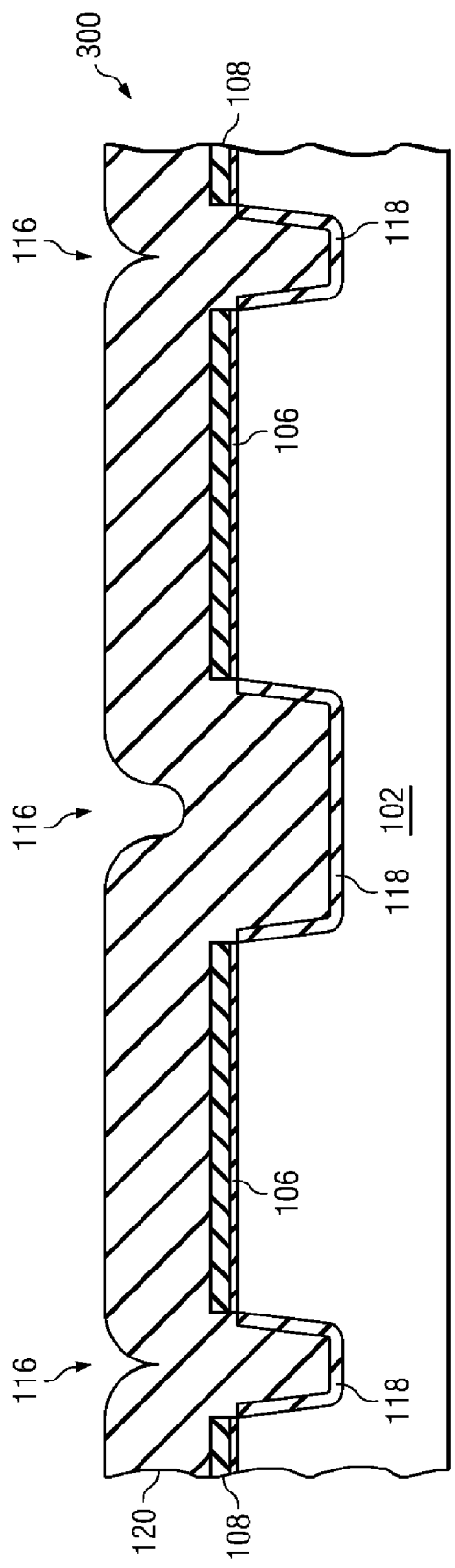
FIG. 3 is a side view of the substrate with STI trenches formed, in accordance with another aspect of the invention.

The present invention will now be described with reference to the drawings wherein like reference numerals are used to refer to like elements throughout. The present invention provides a method for depositing a thick oxide film on the backside of wafers to reduce large wafer backside contamination. However, it will be appreciated that the invention may be advantageously employed in applications other than those illustrated and described herein.

Referring to the drawings, FIGS. 1-10 are described in accordance with one embodiment of the invention that relates to front end of line processing (FEOL). FIGS. 11-18 pertain to back end of line processing (BEOL) and involves depositing a thick oxide film on a wafer backside prior to the wafer metallization loop or BEOL. The process allows semiconductor devices to be manufactured with higher yields, less processing steps, and the like. It is appreciated however that the thick oxide film could be deposited in more than one layer or at a different time within the process and all embodiments are contemplated, herein.

FIG. 1 is a side view of a partial exemplary memory device 100, for example. The memory device 100, incorporates a semiconductor substrate 102 in which one or more $V_t$ implants 104 can be performed, for example. The core implant 104 can be performed to establish a region of the substrate that is more heavily doped than the remainder of the semiconductor substrate. The substrate can, for example, be formed out of silicon and can itself be doped with a p-type impurity such as boron, for example. The implant 104 may include a greater concentration of and/or a higher energy implant of p-type dopant than utilized in the rest of the substrate, for example, and assists in controlling voltage of the memory cell 100. FIG. 1 is considered part of the "front end of the line" processing (FEOL).

It is to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding and that actual dimensions of the elements may differ substantially from that illustrated herein.

Referring to FIG. 2 illustrated is a partial memory device 200, wherein an isolation pad oxide layer 106 and an isolation nitride layer 108, for example, can be deposited over the semiconductor substrate 102 of the memory device 200. A photoresist layer 110 can be formed over the isolation nitride layer 108, and can be patterned, exposed, and developed in order to form a shallow trench isolation (STI) patterned moat, for example. The oxide isolation layer 106 and the nitride layer 108 can be plasma etched in an anisotropic process, wherein they are etched in the vertical direction only. The formation of STI within a substrate 102 is well known by those of ordinary skill in the art.

The nitride layer 108 may be deposited using several techniques which include deposition by evaporation, sputtering, chemical-vapor deposition (CVD), and the like. In evaporation deposition, a solid material is placed in a vacuum chamber and heated until it evaporates. A portion of hot evaporated molecules condense on the cooler wafer surface to form a solid layer of material on the dielectric surface. The thickness of the nitride layer is determined by the temperature profile of the chamber and the amount of time the substrate is exposed to the evaporation process. Sputtering is a technique that employs positive ions that bombard a cathode, which is coated with the material to be deposited (e.g., the nitride). The bombarded material is removed by direct energy transfer and deposited on the wafer/dielectric surface which is electrically coupled to an anode. The types of sputtering systems utilized in nitride depositions of integrated circuits include, for example, DC, radio frequency (RF), magnetic, and the like. Chemical vapor deposition (CVD) employs a process in which the nitride layer is deposited by a chemical reaction in a gas phase which occurs adjacent to the silicon wafer. This deposition process is used to deposit, for example, silicon nitride ($Si_3N_4$), and the like. CVD is typically performed at reduced pressures because the diffusivity of the nitride increases significantly, however it can also be performed at atmospheric pressure, for example. This technique is known by those of ordinary skill in the art as low-pressure chemical-vapor deposition (LPCVD).

The nitride layer 108 can provide protection for an electrical device "active area" during formation of the shallow trenches. The nitride layer 108 can be, for example, SiN, silicon nitride ($Si_3N_4$), reaction bonded silicon nitride (RBSN), hot pressed silicon nitride (HPSN), sintered silicon nitrides (SSN), and the like. The dielectric oxide layer 106 and the nitride layer 108 together form what is often referred to as a "hard mask". During pattern transfer to an integrated circuit device, the hard mask layer is consumed during an etching process, for example. However, it is to be appreciated that any hard mask techniques may be practiced in this invention, and that other hard mask materials and masking processes are contemplated as falling within the scope of the invention.

The photoresist 110 can be applied, as illustrated in FIG. 2, which, for example, can then be utilized to pattern and etch the nitride layer 108 and the pad oxide layer 106 in order to result in a patterned substrate 102 with STI. The photoresist 110 can be, for example, a solvent-based, light-sensitive resin solution that is uniformly applied, for example, on the nitride layer 108 of the wafer, utilizing a spin type process, and the like. The photoresist 110 can, for example, be a chemical, negative photoresist 110 that hardens when exposed to ultraviolet light 112 or other light wavelengths and the unexposed photoresist 110 can be dissolved by employing a developer solvent, leaving openings 114 in the exposed photoresist 110. Another approach involves utilizing a positive photoresist 110 that is initially insoluble, and when exposed to, e.g., UV, mercury light, laser, x-rays, electron beam, etc., becomes soluble. After exposure, the photoresist 110 can create the etch pattern needed to form recessed active trenches during, for example, reactive ion etching (RIE).

FIG. 2 illustrates, for example, exposing the layered substrate 102 to the ultraviolet light 112 after the nitride 108 outer surface has been coated with a uniform layer of photoresist 110 and the photoresist 110 has been cured sufficiently, in order to define regions of the device 200. The memory device 200 can be exposed by employing, for example, the ultraviolet light 112 through the patterned mask opening. The mask can be, for example, a glass plate on which an image corresponding to the circuit design is registered. The photoresist 110 can be positive photoresist, negative photoresist, or both. Depending on the type of the photoresist 110 either the image or non-image portion of the photoresist 110 can be removed in a photoresist developer. Utilizing positive photoresist 110 in FIG. 2 can result in exposed photoresist 110 softening which can then be washed away utilizing a developing solution, for example. Development can be carried out, for example, by immersion developing, spray developing, puddle developing, and the like.

Next, as represented in a partial memory device 300 in FIG. 3, a plasma etching process can be performed to remove the nitride layer 108 and the dielectric layer 106 (oxide pad) in shallow trench isolation regions 116. The STI 116 can be formed in those areas or openings where the photoresist was removed in the previous process or fabrication step. The recessed STI trenches 116 can be formed employing any known etch process or technique by one of ordinary skill in the art and all of these techniques are contemplated as falling within the scope of the invention.

Selectively masking the active regions of the wafer with photoresist and leaving the selective regions exposed to the etchant can create trenches 116 in a designed fashion. The etching procedure may be, for example, a single step or multi-step process, a wet or dry etch process, by which material is removed in the selected active regions in the semiconductor substrate 102 to form the recessed active trenches 116. For instance, a first plasma etch step may be employed to eliminate the majority of the silicon wafer trench material, before a second dry etch step is performed to etch away the remainder of the silicon trench material at the openings in the photoresist mask, creating the example isolation trenches 116. Any appropriate single or multi-step trench creation process, known by those of ordinary skill in the art, may be employed in accordance with the present invention.

FIG. 3 also illustrates the creation of dielectric trench liners 118 formed over the exposed portions of the STI trenches 116 within the substrate 102, for example. The memory device is electrically insulated from other active devices by STI structures formed within the substrate; however, any isolation structure can be used such as LOCOS regions, for example, and all such isolation structures are contemplated in the invention. The dielectric trench liners 118 can be formed to a thickness of about 3-30 nanometers, for example. The trench dielectric liner 118 can be formed in any appropriate manner, such as, for example, a thermal dielectric growth process at the exposed trench surfaces of the etched trench 116. The trench dielectric liner 118 can be employed, for example, to round the corners at the bottom of the trench, to act as a protective layer at the bottom of trench (protect the silicon from damage), to act as a high purity spacer between the silicon and the fill dielectric, and the like. The remaining dielectric pad 106 and nitride layer 108 (FIG. 2) can prevent oxidation in the active regions when the trench dielectric liner 118 is grown in the exposed trench 116 of the isolation regions. The trench lining process can be, for example, a thermal process, a LVCVD process, a thermal process bi-layered liner, a chemical oxide process in combination with LPCVD film processes, and the like. However, it should be apparent to those of ordinary skill in the art that other trench liner materials, e.g., nitride, multiple isolation liners, no liners at all, and the like, are contemplated within this invention. FIG. 3 represents an embodiment of the present invention illustrating the isolation nitride 108 removal with a phosphoric acid at elevated temperature and SC1 megasonic, for example. The SC1 process is widely used in the semiconductor industry for many wet-chemical cleaning processes. A subsequent HF clean can be utilized to reduce dielectric defect failures, for example. In addition, FIG. 3 illustrates the oxide 106 removal in the trench area that is well known by those of ordinary skill in the art.

Figure 4:
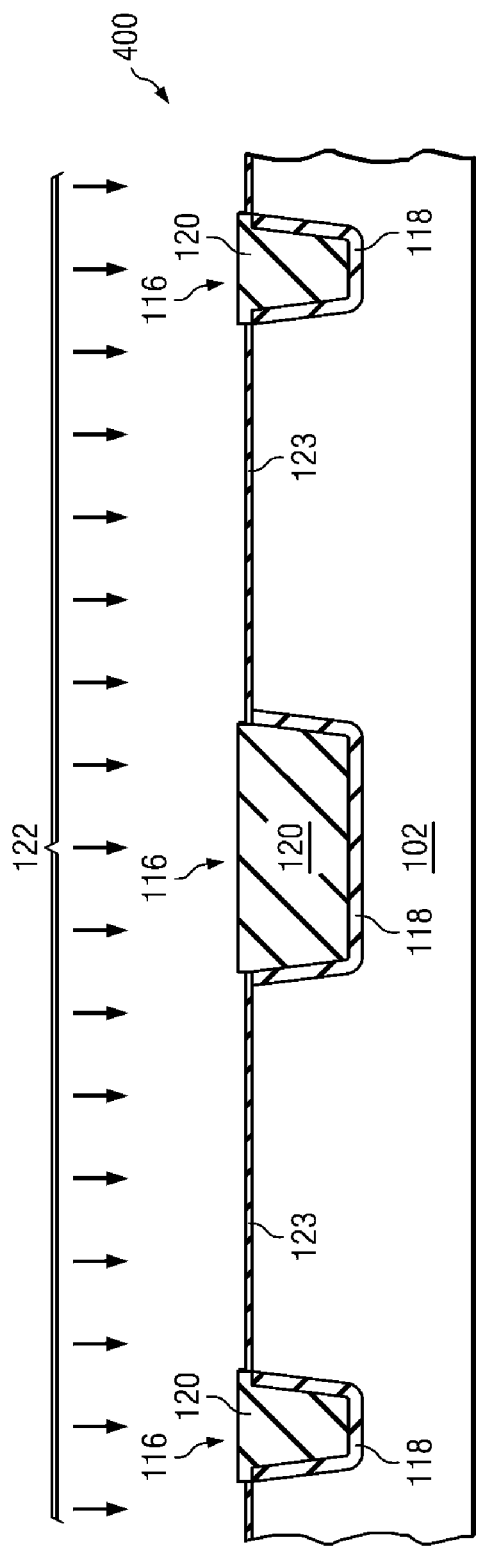
FIG. 4 is a side view illustrating the substrate with the formed STI according to yet another aspect of the present invention.

FIG. 3 also illustrates another embodiment of the present invention, a high voltage gate oxide 120 deposition process. The high voltage oxide layer 120 can be applied on top of the substrate surface 102 utilizing techniques well known by those of ordinary skill in the art. A partial memory device 400 is illustrated in FIG. 4, wherein chemical mechanical polishing (CMP) 122 can be carried out to remove a portion of the high voltage oxide 120. The CMP 122 can be followed by a post-CMP lot clean, for example, to remove debris from the wafer. The oxide 106 can be removed at 400 as well, using any technique known by one of ordinary skill in the art. The processing in FIG. 3 and FIG. 4 is considered part of the "front end of the line" processing (FEOL) and can be referred to as a portion of the "front end processing".

FIG. 5 illustrates a $V_t$ implant 124 of the partial memory device 500 of the NMOS region 128, wherein a PMOS region 130 is covered with a photoresist 126 to block ion implantation 124 in that region 130. The photoresist 126 can be deposited as discussed supra. The implant 124 can be a boron type implant 124 and the implant may include a greater concentration of high energy implant n-type dopant than utilized in the rest of the substrate, for example, and assists in controlling the voltage of the memory cell 500. The implant 124 can include a Vt adjust implant, an N channel implant, a punch-through implant, a well implant, a channel stop implant, and the like. A post implant clean 132 can be performed subsequently to the implantation 124. The implantation 124 and the clean 132 are part of the "front end of the line" processing (FEOL) and can be referred to as a portion of the "front end processing".

FIG. 6 is an implantation 136 of the partial memory cell 600 of the PMOS region 130. The NMOS 128 is covered with a photoresist 134 to block ion implantation 136 of the NMOS region 128. The photoresist 126 can be deposited as discussed supra. The implant 136 can include a greater concentration of and/or a higher energy implant of p-type dopant utilized in the PMOS region 130 of the substrate, for example, and assists in controlling the voltage of the memory cell 600. The implantation 136 can include a Vt adjust implant, a P channel implant, a punch-through implant, a well implant, a channel stop implant, and the like. A post implant clean 138 can be performed subsequently to the implantation 136 and the cleaning process 138 is well known by those of ordinary skill in the art. The P channel implantation 136 and the clean 138 are part of the "front end of the line" processing (FEOL) and can be referred to as part of "front end processing".

Figure 7:
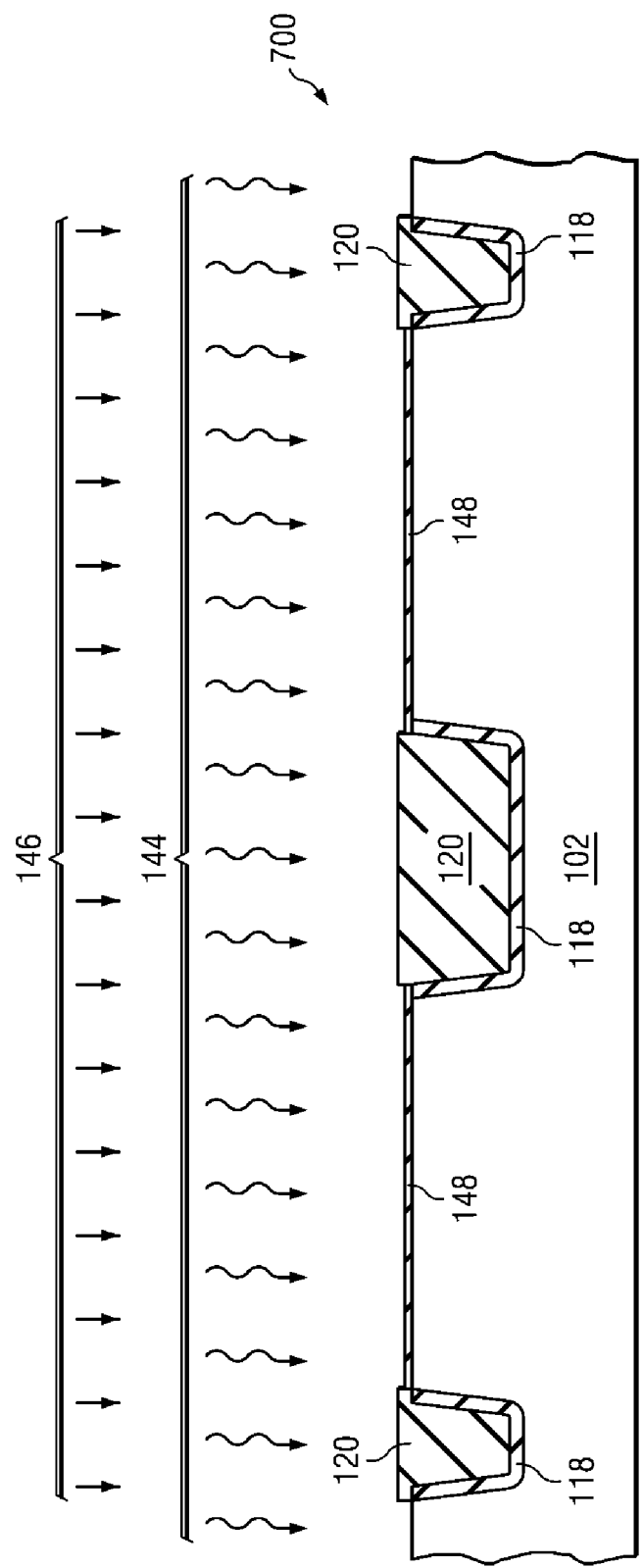

The partial memory cell 700 of FIG. 7 illustrates wherein the photoresist is removed as discussed supra. The process can involve a high temperature repair anneal 144 to compensate for crystalline damage in the substrate 102, for example. The ion implantation process inherently produces damage in the silicon substrate 102 and it is therefore necessary to follow up the implantation process with a repair process such as the high temperature, annealing process 144. The annealing process 144 is a physical transformation (e.g., as opposed to a chemical reaction) of the device 700 induced by the application of thermal energy. The annealing process 144 repairs or corrects most of the silicon damage and produces high dopant activation fractions. Subsequently a high voltage gate oxide 148 can be deposited on the substrate following a pre-gate clean 146, for example. The processes illustrated in FIG. 7 are part of the "front end of the line" processing (FEOL).

Figure 8:
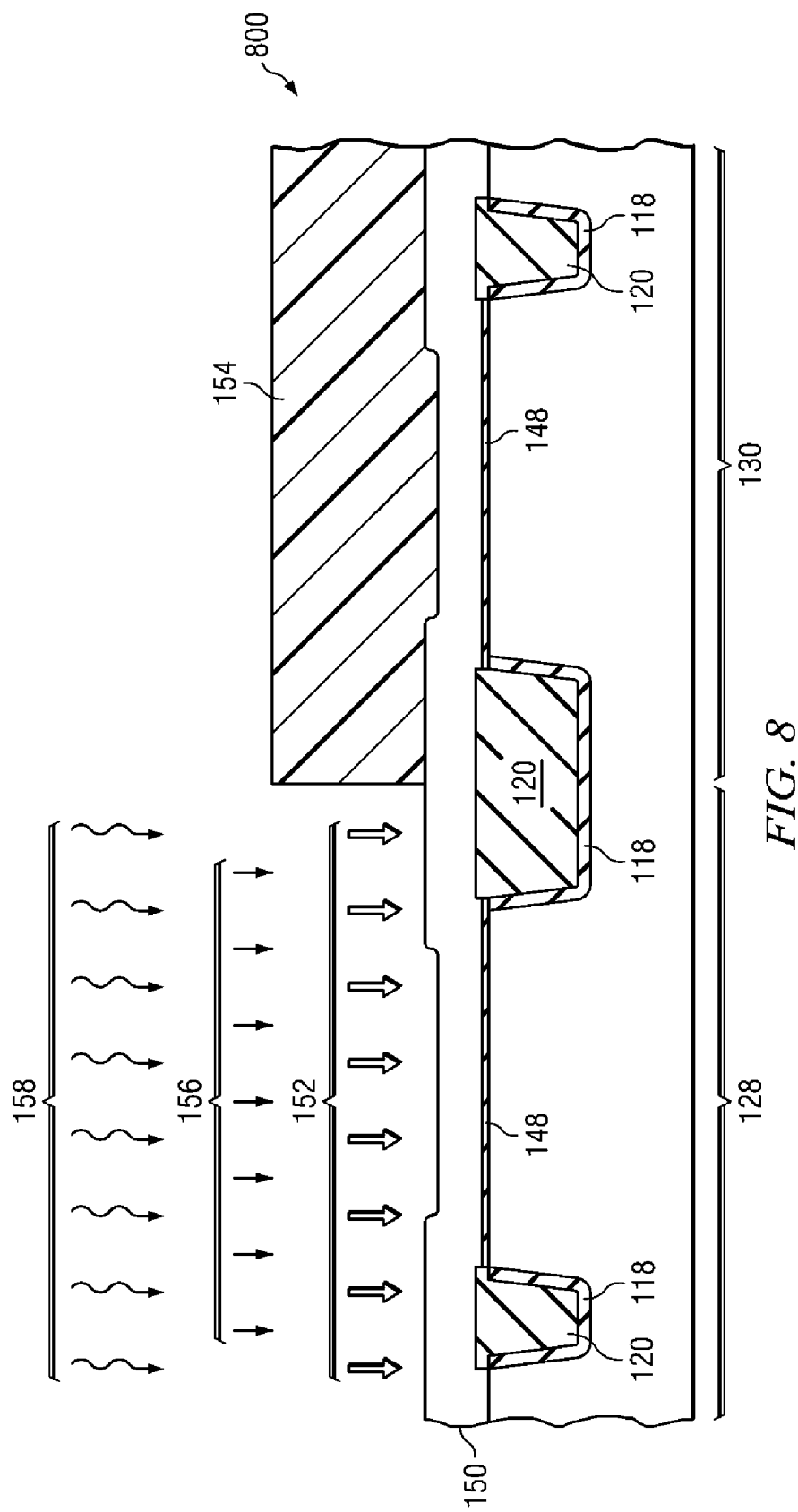

Illustrated is a portion of the memory device 800 in FIG. 8, wherein a polysilicon gate 150 is deposited on the high voltage gate oxide 148 (FIG. 7). An N+ polysilicon implantation 152 is performed at 800 with the PMOS region covered with photoresist 154. The depositing, exposing, developing, and the like, of the photoresist 154 are well known by those of ordinary skill in the art. The N+ polysilicon can be patterned

Figure 9:
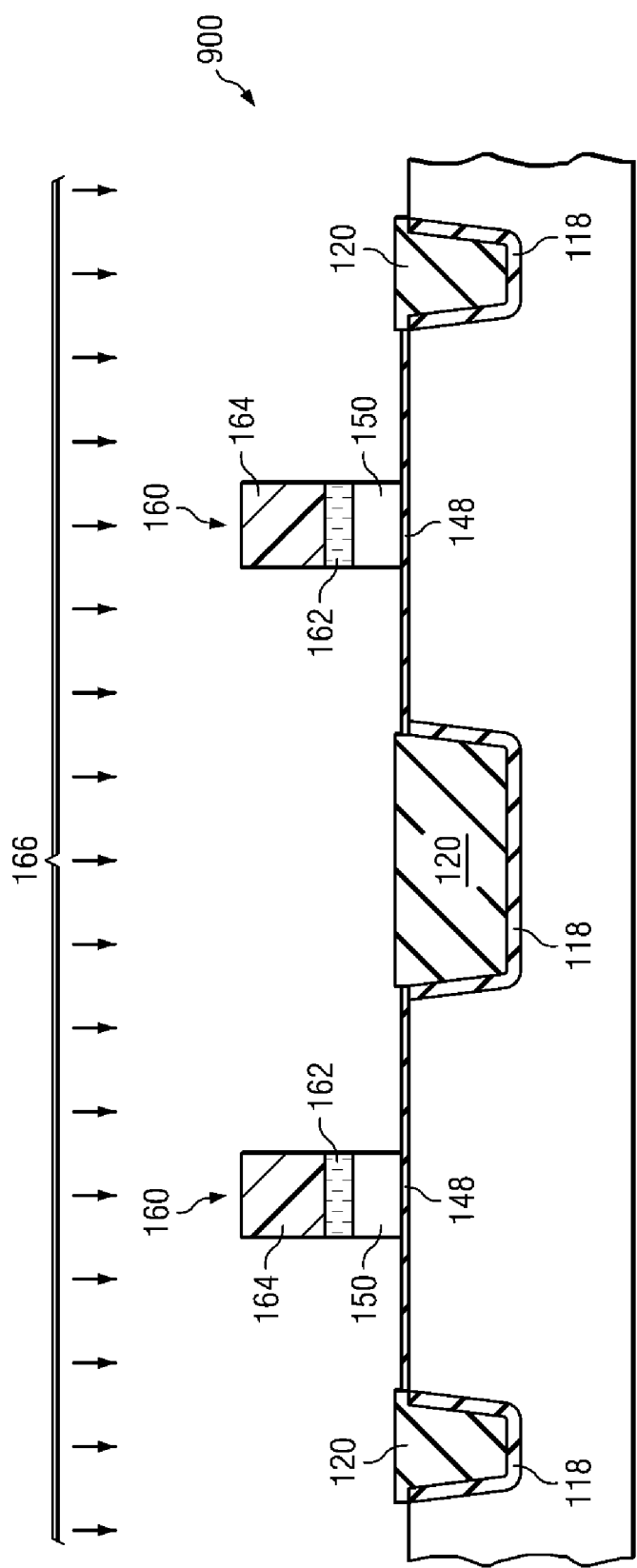

156 as illustrated in FIG. 8 followed by a polysilicon clean 158 and anneal. The same procedure can be completed for the PMOS region 130. FIG. 9 illustrates the further gate patterning 160 well known by those of ordinary skill in the art. A bottom anti-reflective coating (ARC) 162 is applied on the polysilicon gate 150, wherein the ARC 162 is used to improve control of critical dimensions by suppressing wave effects and reflective errors caused by thin film interference. The ARC 162 is then coated with a photoresist 164 that is exposed to UV light, for example, developed and removed. A gate etch 166 is then performed that is known by one of ordinary skill in the art.

Figure 10:
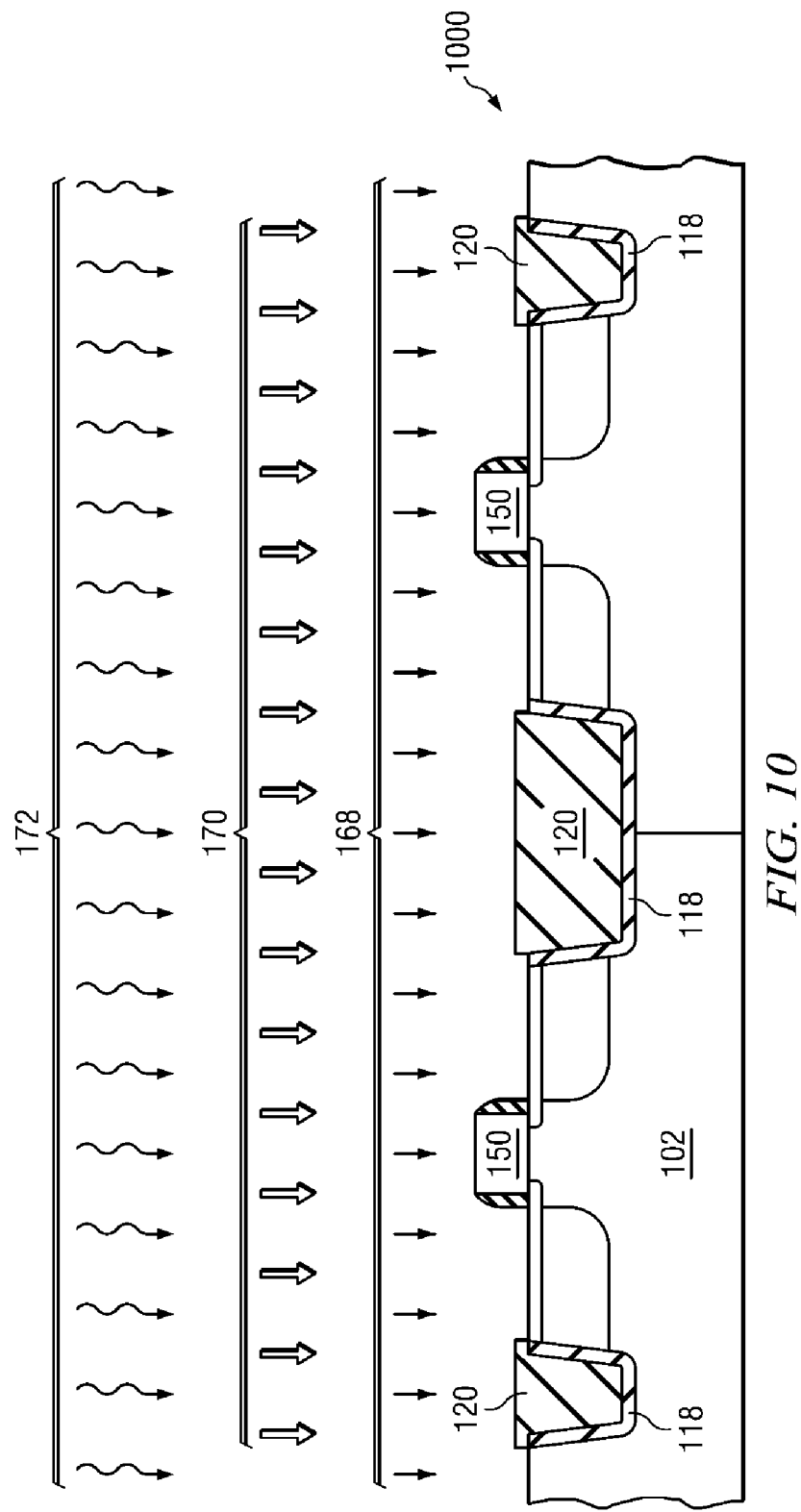

FIG. 10 illustrates the formation of a portion of a memory device 1000, wherein various depositions 168, resist coating, resist developing, resist removing and etchings are known and can be performed by those of ordinary skill in the art. Implantation 170 can be performed which can include high current arsenic implants, boron implants, arsenic implants, and the like. The implantation 170 can be followed by a rapid thermal anneal (RTA) 172 which is employed to repair damage caused by the various implantations 170. The processes illustrated in FIGS. 8, 9 and 10 are considered part of the "front end of the line" processing (FEOL).

Figure 11:
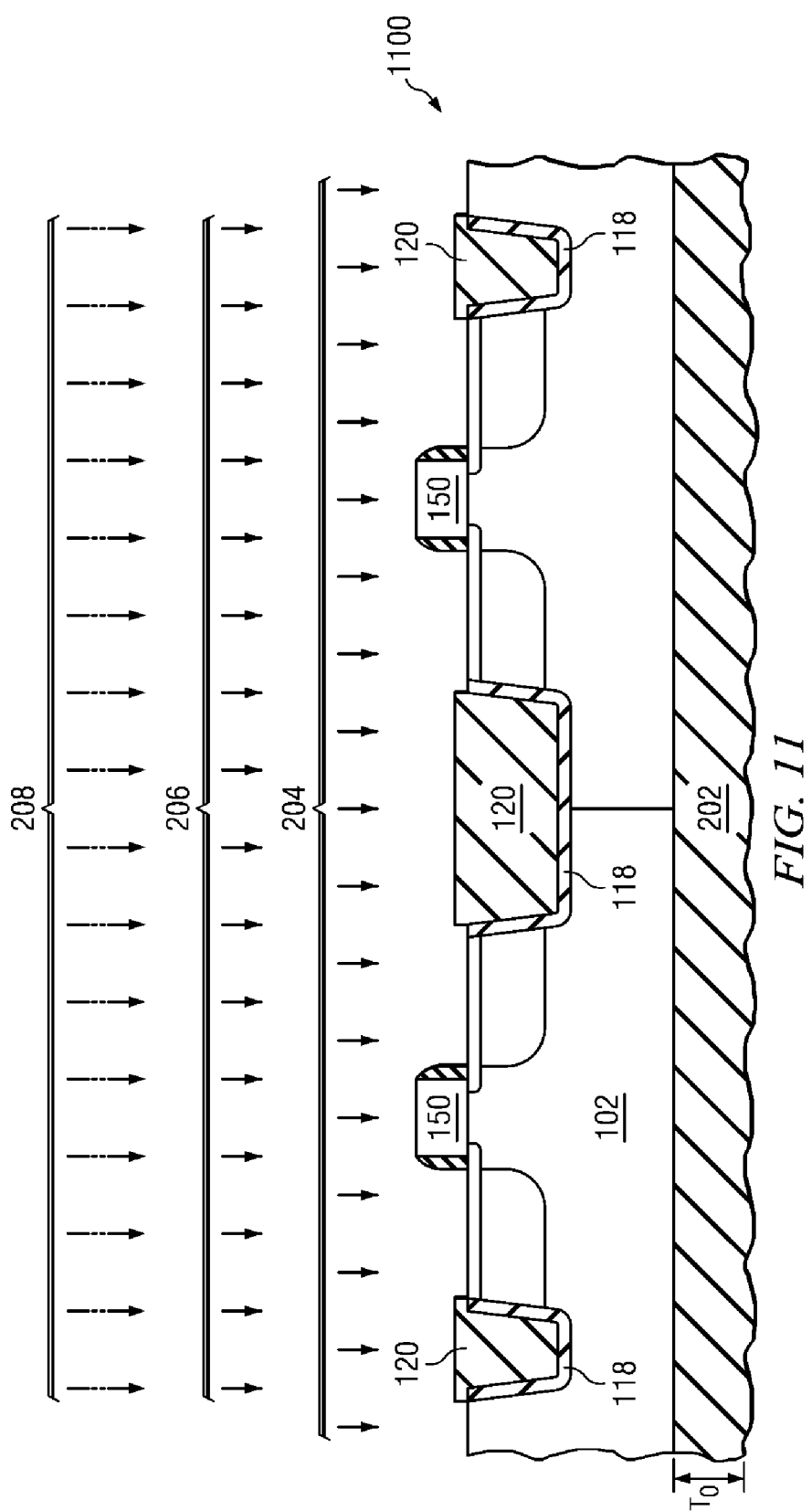

FIG. 11 illustrates a memory device 1100 at the beginning of the "back end of the line" processing (BEOL) loop, for example. All of the subsequent FIGS. correspond to BEOL processing. A thick oxide film 202 can be deposited on backside of the wafer 102 prior to the BEOL loop in order to reduce the backside contamination that normally takes place during conventional processing. The use of the thick oxide film 202 is optimal for chemical mechanical polish (CMP) cleaning, for example, as the backside oxide film 202 is nearly identical in composition to the oxide film on the wafer frontside. CMP cleaning processes include etching chemistries to remove large particles/contaminants from oxide or metal/oxide films. The thickness of the backside oxide film ($T_b$) is dependent on the etch rate ($r_i$) of the oxide film for each given process (i) and the total etch time ($t_{Ti}$) for the various BEOL cleaning applications along with a selected minimum thickness, k, that is selected for a given application. The formula for determining the thickness of the backside oxide film 202 is:

$$T_b = r_1 t_{T1} + r_2 t_{T2} + r_3 t_{T3} + \ldots + k$$

where $T_b$ is the total thickness of the backside oxide film 202, $r_1$ is the etch rate for cleaning process one, $t_{T1}$ is the etch time for the same cleaning process one, and the like. The initial thickness ($T_b$) of the backside oxide film 202 is $T_0$, the maximum thickness of the deposition, for example, in one embodiment in which the backside oxide is a single deposition. However, it should be apparent to one of ordinary skill in the art that the backside thick oxide could be deposited utilizing more than one wafer backside oxide deposition. The cleaning processes can be chemical backside clean, distilled water (DIW) Scrubber, CMP cleans, solvent bath cleans, and the like. It should be noted that several of these cleaning processes do not remove particles or etch whereas others remove large particles and/or etch the wafer. Various wafer cleaning and etching processes are well known by those of ordinary skill in the art and may be employed in accordance with the present invention.

Deposition of the backside oxide 202 can occur after deposition of thick frontside cap oxide 204 (>1000 Å) using a chemical vapor deposition (CVD) tool, for example, so that wafer frontside is minimally impacted, for example. The wafer can be repositioned for backside deposition using a wafer flip tool before and after backside wafer deposition or a deposition tool can be fitted to the wafer flip module (not shown), for example. Another technique for applying the oxide 202 to the backside of the wafer is by employing furnace deposition, for example. Based upon the formula described supra the minimum oxide thickness is: $T_b = k$.

A cap oxide etch 206, in FIG. 11 is then performed, wherein the cap oxide 204 can be etched off by a plasma dry etch, for example to remove any possible cap oxide filaments. In the example shown, the etch 206 can be followed by a cobalt sputter or deposition 208, for example. The deposition 208 can be formed using solid phase crystallization (SPC) to a thickness of about 100 Angstroms or less, for example, while the cap oxide 204 can be formed to a thickness of about 1K Angstroms or less, for example. Cobalt silicide 208 has matured into an important alternative to titanium silicide, and the like, because of the ease of forming it in small dimensions. The cobalt silicide 208 may be formed, stripped and annealed utilizing techniques that are well known by those of ordinary skill in the art. Alternatively, other types of depositions may be performed in accordance with one or more aspects of the present invention.

Figure 12:
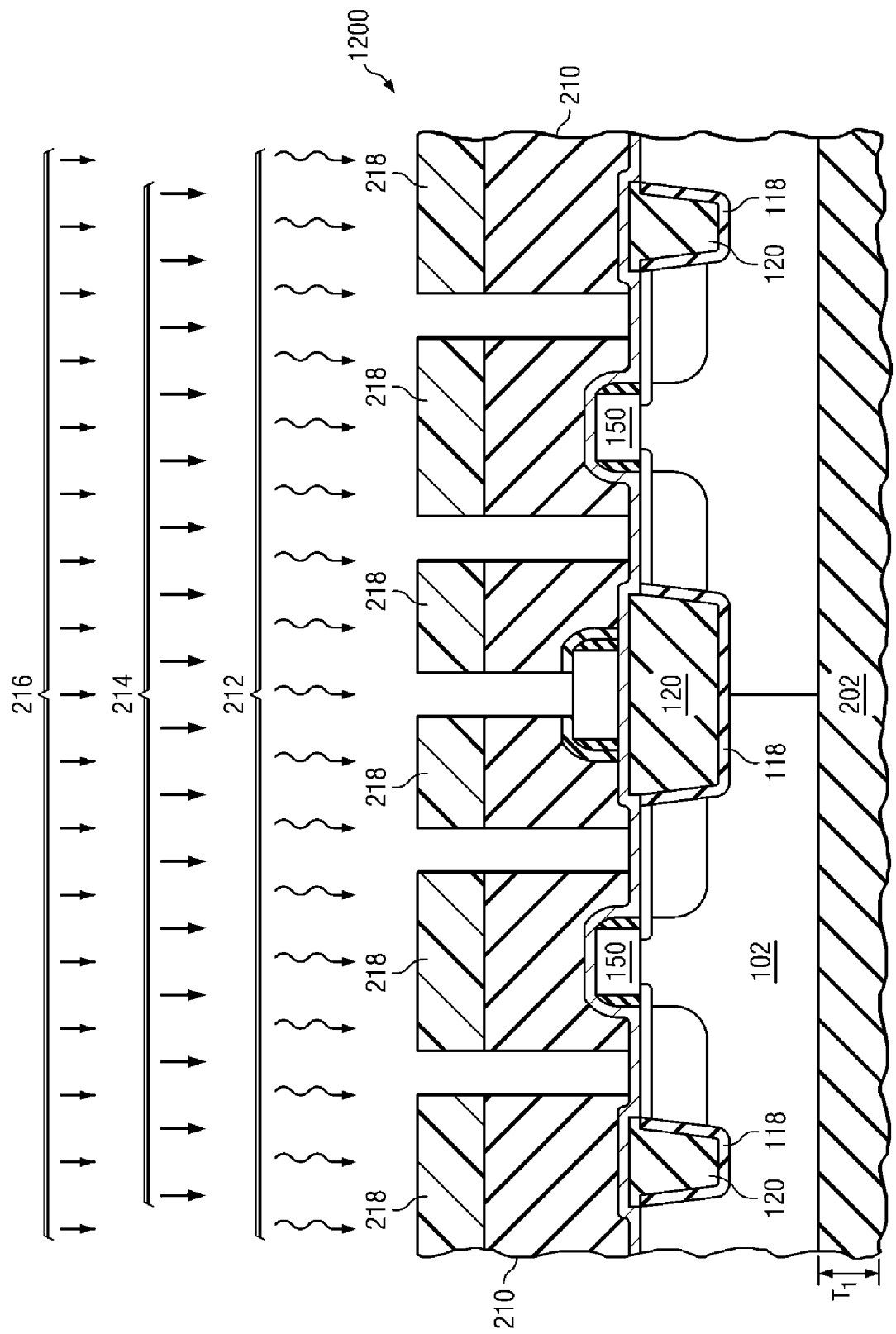

FIG. 12 illustrates a pre-metal dielectric (PMD) deposition 210 that can then be formed by sub-atmospheric chemical vapor deposition (SACVD) phosphorus-doped silicon oxide (PSG), an SPC deposition, and the like, for example. The pre-metal dielectric (PMD) deposition 210 can be formed to a thickness of between about 15K Angstroms or less. The PMD 210 deposition can be followed by a PMD anneal 212 in a $N_2$ gas environment, to improve the density of the PMD 210, for example. A first photoresist layer 218 can then be deposited over the PMD 210. The depositions (210 and 218) can be followed by a CMP 214 and a CMP clean 216 process well known by those of ordinary skill in the art. The CMP clean 216 can remove oxide on the frontside of the wafer as well as backside wafer thick oxide 202. The backside wafer oxide 202 thickness is now $T_1$, which is equal to $T_0$ minus $r_1 t_{T1}$ (the oxide removed by the CMP clean). The photoresist 218 can be patterned, exposed and removed, for example as shown in FIG. 12 to pattern contact openings. In another embodiment of the present invention an optional antireflective coating (ARC) layer, such as silicon nitride or silicon oxynitride, for example, can be formed, and the photoresist 218 formed over the ARC layer to facilitate patterning.

Figure 13:
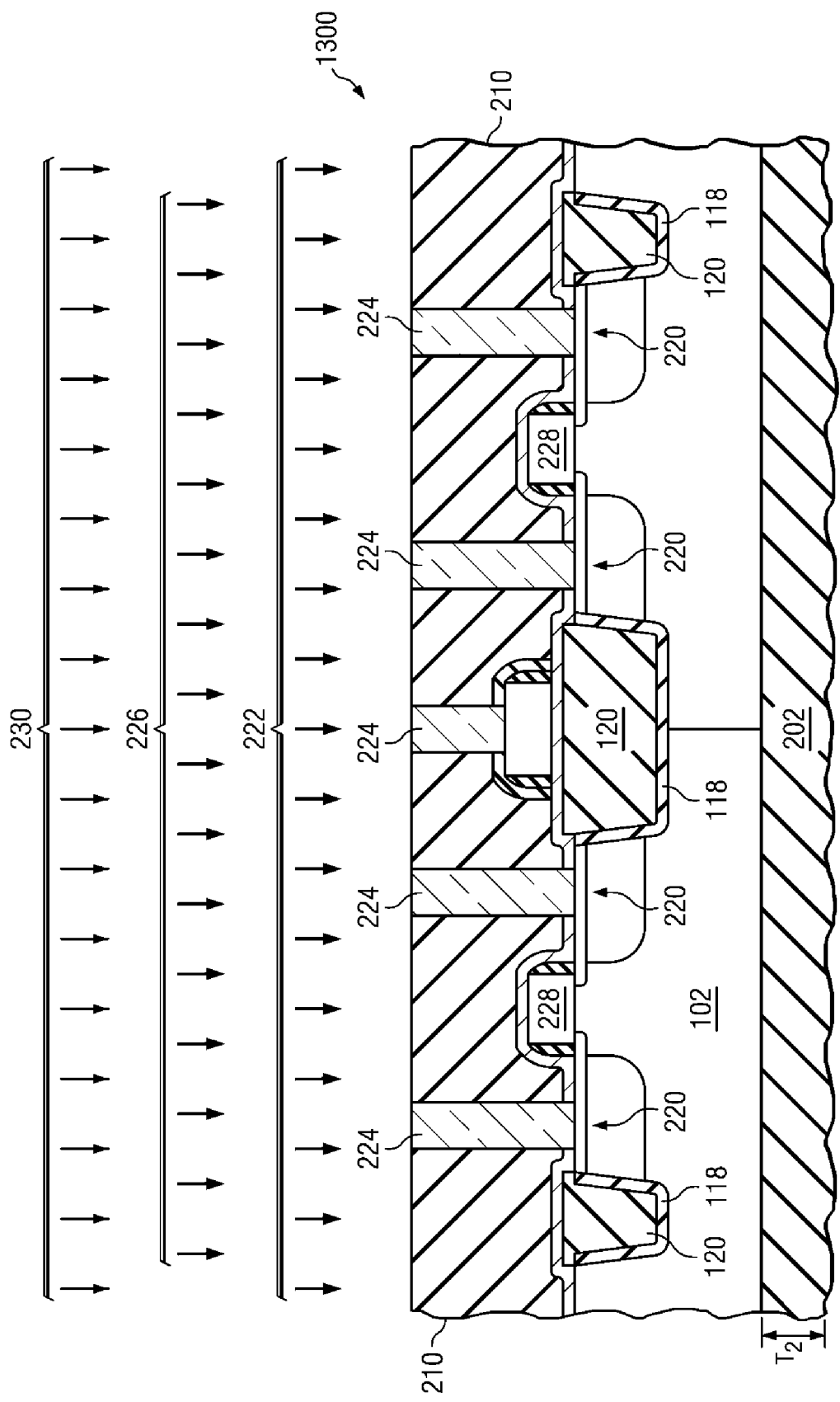

The layer of photoresist material 218 (FIG. 12) can be subsequently removed on the memory device 1300 in FIG. 13. A CNTS barrier metal to act as an etch stop, for example, may be fabricated by creating a CNT-metal junction 220 on the silicon substrate 102 by employing electron-beam lithography. The openings between the resist 218, shown in FIG. 12, can be filled with silicide to form metal contacts 224 using techniques known to those of ordinary skill in the art. The entire wafer can then be subjected to chemical mechanical polishing (CMP) 226 to remove any excess silicide material in the metal contacts 224 and to planarize the surface of the structures thereon. It will be appreciated that in a three dimensional perspective this results in "strips" of silicide material metal contacts 224 in parallel with the patterned gate. A subsequent CMP clean 222 removes debris and oxide on the frontside of the wafer as well as the backside wafer oxide 202. The backside wafer oxide 202 thickness is now $T_2$, which is equal to $T_0$ minus $r_1 t_{T1}$, minus $r_2 t_{T2}$ (the oxide removed by the second CMP clean, for example).

Figure 14:
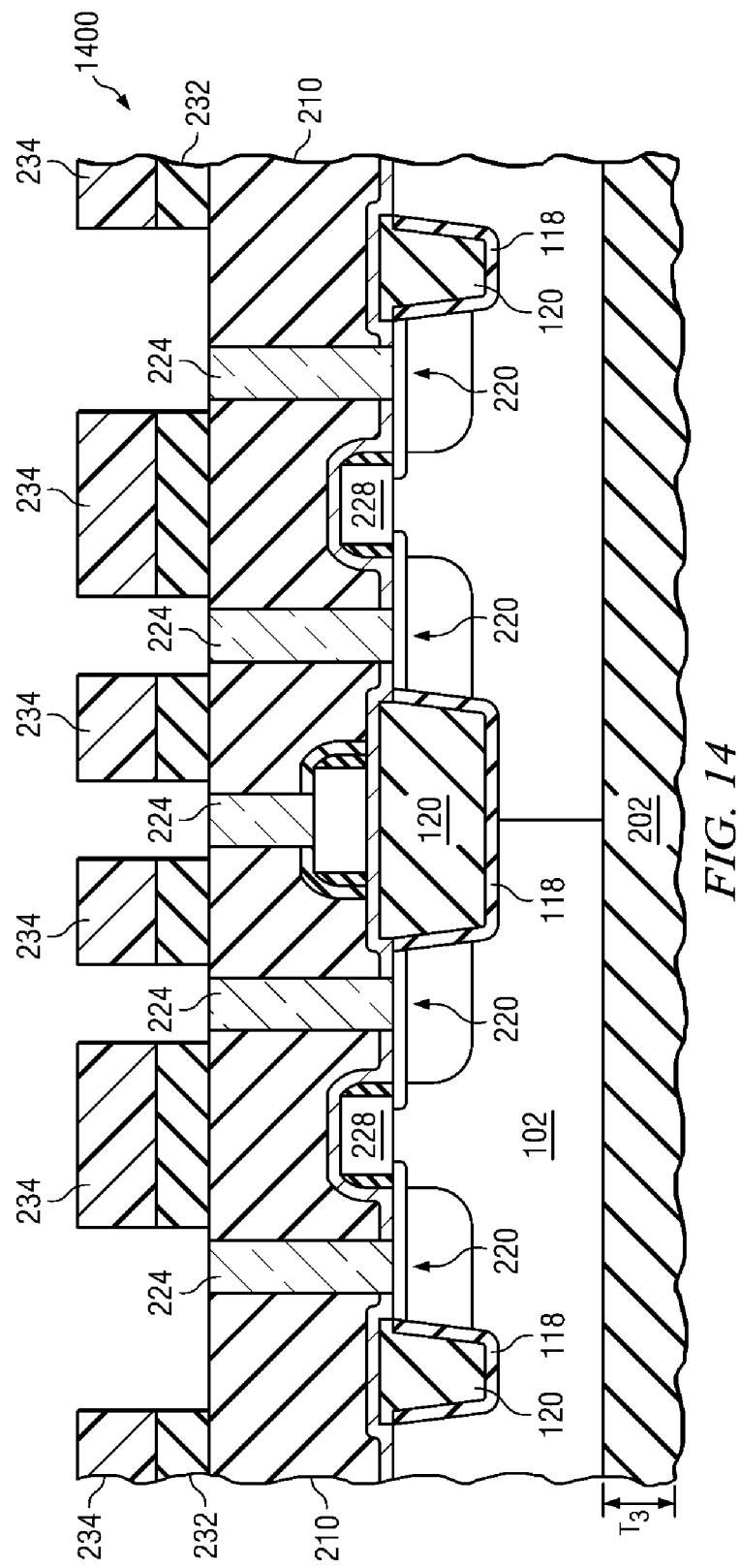

FIG. 14 illustrates a memory device 1400 that incorporates a metallic barrier (not shown) that can be fabricated using nickel titanium (NiT) fluorinated silicate glass (FSG) deposition. A bottom ARC coat layer (not shown) can be formed over a second inter-metallic dielectric (IMD) 232 and a second photoresist layer 234 formed over the ARC. The two layers and the ARC coat (242 and 234) can then be patterned, exposed, etched and/or selectively stripped to form a combined photomask for transferring a pattern onto the memory device 1400. The backside wafer oxide 202 thickness would remain constant at $T_2=T_3$ if there was no cleaning/etching process employed in FIG. 14, for example.

Figure 15:
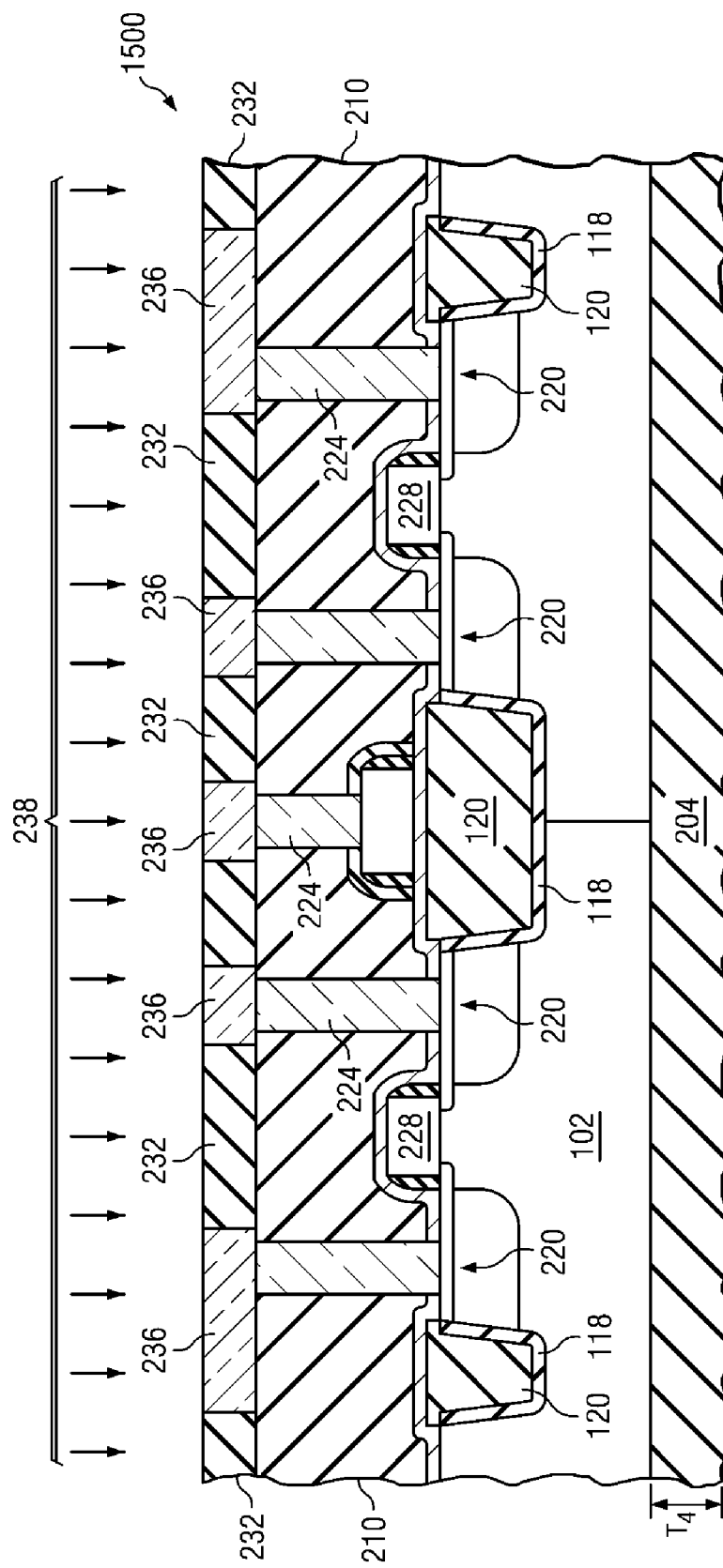

Referring to FIG. 15, a memory device 1500 is illustrated; wherein metal interconnects 236 are conveniently formed on top of the metal contacts 224. These silicide metal interconnects 236 can reduce the resistance between these conductors and interconnects to be formed thereon, and can be selected from the silicides of nickel, titanium, cobalt, platinum, and the like. The formation and patterning of the metal interconnects 236 is followed by a cleaning process 238 that etches both the frontside and backside oxide layers. The backside wafer oxide 202 thickness is $T_4$, which is equal to $T_0$ minus $r_1 t_{T1}$, minus $r_2 t_{T2}$ minus $r_3 t_{T3}$ (zero) minus $r_4 t_{T4}$ (the oxide removed by the CMP clean).

Figure 16:
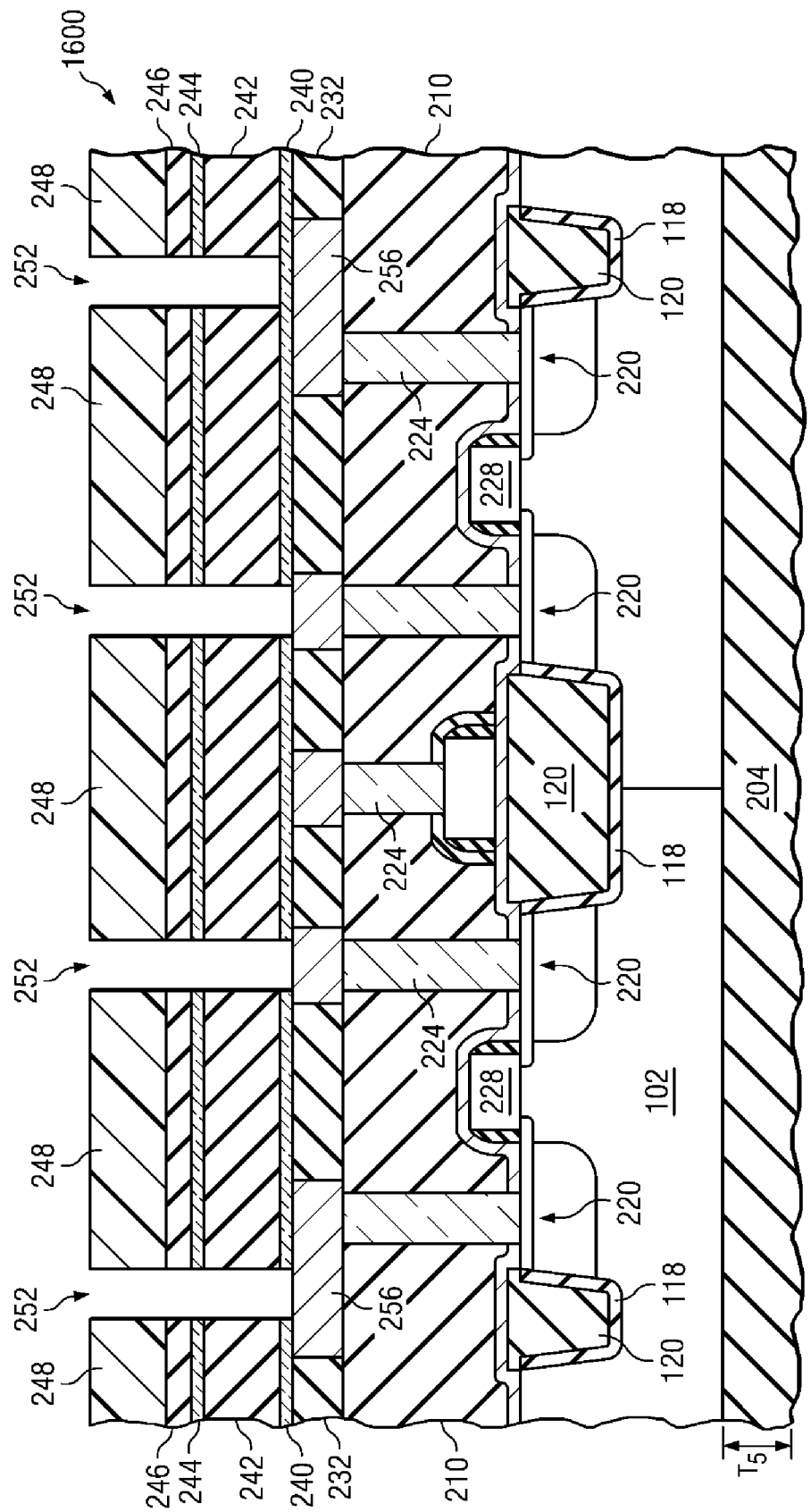

A partial memory device 1600 is illustrated in FIG. 16, wherein a nickel titanium (NiT) fluorinated silicate glass (FSG) deposition 240 is employed followed by an ARC coat layer (not shown) that can be formed over the IMD 242 and the metal interconnect 236 (FIG. 15). A second nickel titanium (NiT) fluorinated silicate glass (FSG) deposition 244 can be deposited followed by a second IMD 246. A photoresist 248 can be deposited on the second IMD 246 and the layers can then be patterned, exposed, etched and/or selectively stripped to form a combined photomask for transferring the pattern onto the memory device 1600. More particularly, respective spacings 252 correspond to second metal contact locations that can be deposited.

Figure 17:
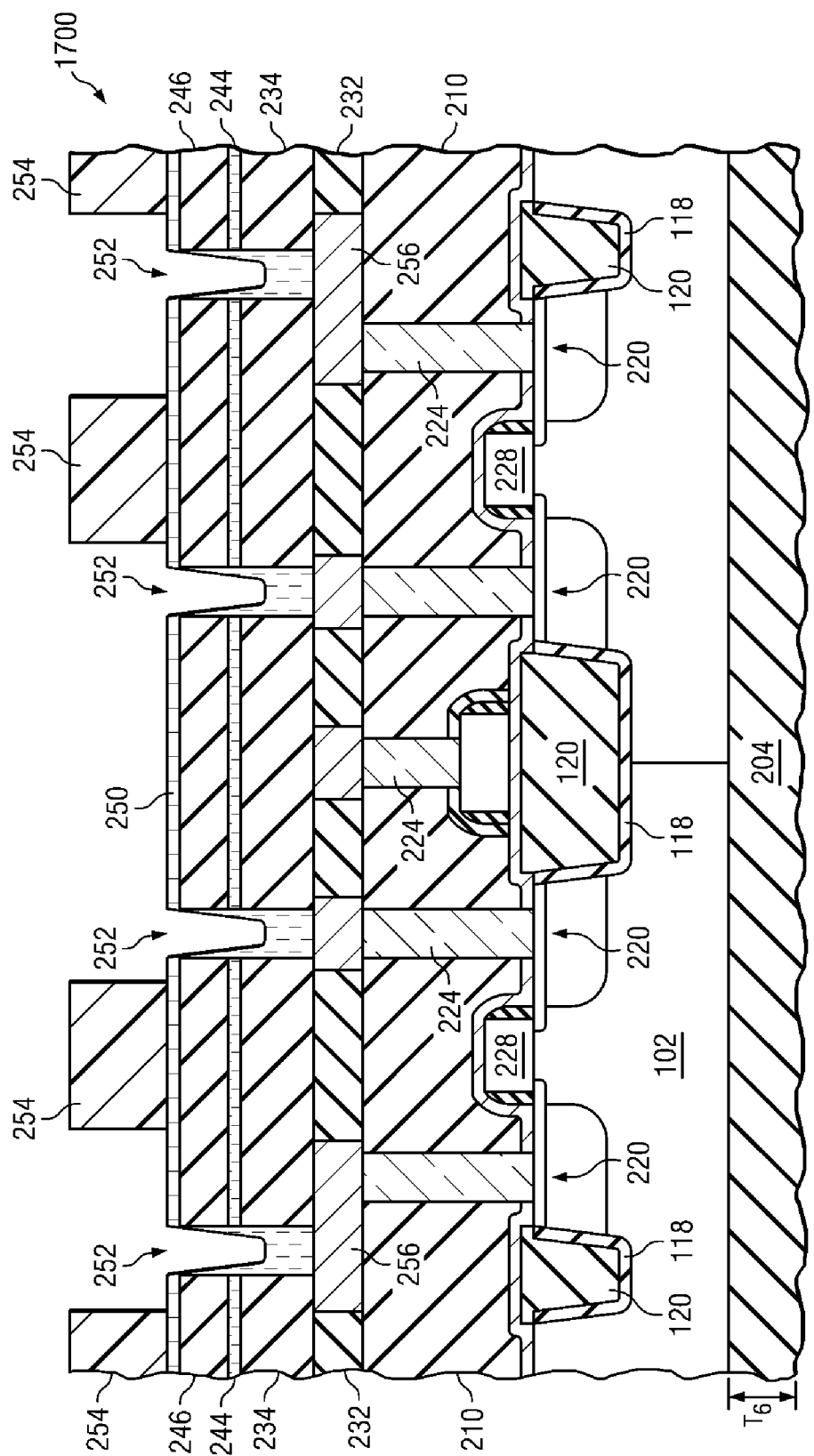
Figure 18:
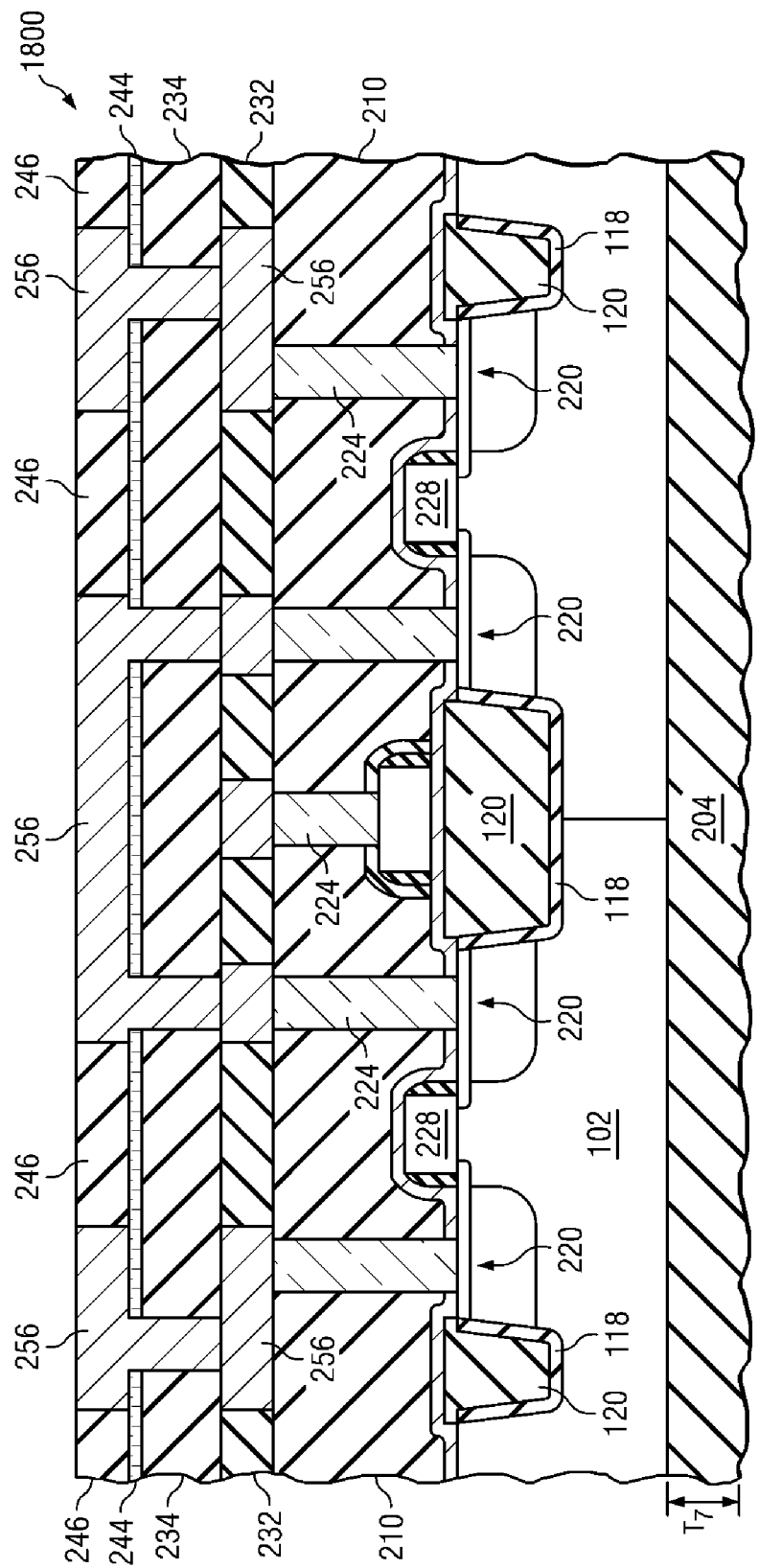

Referring to FIG. 17, a memory device 1700 is illustrated; wherein an ACR coat 250 can be deposited to partially fill the trenches 252 and can act as a protective sacrificial layer, for example. A photoresist 254 can subsequently be deposited, patterned, exposed, etched and/or selectively stripped to form a pattern onto the memory device 1700 for the subsequent formation of metal contacts/metal interconnects 256 as illustrated by device 1800 in FIG. 18. It should be noted that the fabrication of the memory device can continue with numerous process steps including metal interconnect layers, patterning, cleanings and the like. The backside thick oxide layer thickness can be deposited so that the oxide layer has remaining oxide after all of the various cleaning processes.

Figure 19:
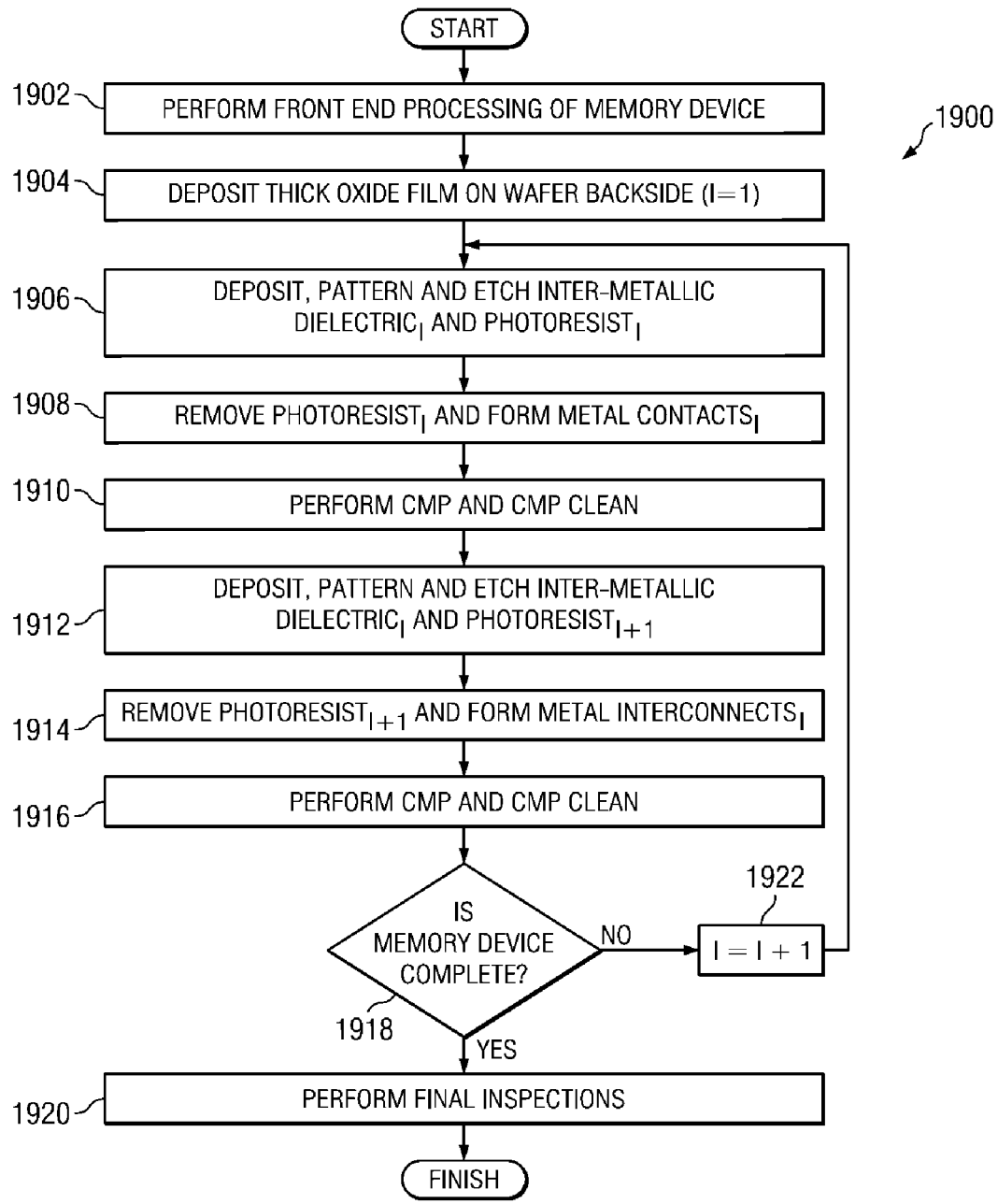
FIG. 19 is a methodology shown graphically, according to yet another aspect of the present invention.

Illustrated in FIG. 19 is an exemplary method for employing a thick oxide film on a wafer backside to reduce large particle contamination in creating a memory device, at 1900, according to one or more aspects of the present invention. Referring now to FIG. 19, an exemplary method 1900 is illustrated which may be advantageously employed in association with one or more memory devices (e.g., device 1800 of FIG. 18), for example, as part of a memory device fabrication. The method 1900 begins at 1902, wherein front end processing of the wafer can be performed to create the memory device (e.g., a CMOS device), for example. The front end processing is well known by those of ordinary skill in the art (e.g., FIGS. 1-10). At 1904, as illustrated and described in greater detail hereinafter, the thick oxide film may be deposited on the wafer backside via chemical vapor deposition (CVP), physical vapor deposition (PVD), electrochemical deposition (ECD), molecular beam epitaxy (MBE) and, more recently, atomic layer deposition (ALD), and the like. For example, the wafer can be positioned for backside deposition using a wafer handling tool or alternatively a deposition tool can be fitted to the wafer handling tool to create the oxide film without flipping the wafer.

The method 1900 proceeds to 1906, whereat back end of line (BEOL) processing begins, for example. However, it will be appreciated that the method may be advantageously employed in association with multiple depositions of thick oxide film on the wafer backside. In addition, it will be appreciated that the depositions can occur at other times within the process/method. At 1906, a pre-metal dielectric (PMD) liner deposition can be formed on the frontside of the wafer followed by a PMD liner anneal in an $N_2$ gas environment, for example. A pre-metal dielectric can be deposited over the liner and a photoresist can be deposited on the PMD and at 1908 can be patterned, exposed and removed, for example, (FIG. 12) to pattern contact openings. An optional antireflective coating (ARC) layer can be formed, and a photoresist can be formed over the ARC layer to facilitate patterning as are well known by those of ordinary skill in the art.

At 1910, the wafer frontside can be subjected to chemical mechanical polishing (CMP) to remove any excess silicide material in the metal contacts and to planarize the surface. From a three dimensional perspective this results in "strips" of silicide material metal contacts in parallel with a patterned gate. A subsequent CMP clean removes debris and oxide on the frontside of the wafer as well as the backside wafer oxide. The backside wafer oxide is reduced in thickness by the CMP clean.

At 1912, a second inter-metallic dielectric is deposited on the frontside of the wafer and a photoresist is subsequently deposited, wherein metal interconnects are formed on top of the metal contacts. The silicide metal interconnects can reduce the electrical resistance between the contacts and interconnects to be subsequently formed thereon, and can be selected from the silicides of nickel, titanium, cobalt, platinum, and the like. The formation and patterning of the metal interconnects can be followed by a CMP and a CMP cleaning process that etches both the frontside and backside oxide layers at 1916. The backside wafer oxide thickness is once again removed.

Further in accordance with the method 1900, it is determined at 1918 if the memory device is complete. If the memory device is complete, the method 1900 proceeds to step 1920 whereat a final inspection can be performed, for example. However, if the memory device is not complete, the method 1900 proceeds to 1922, wherein the integer i is incremented by one and the method proceeds to 1906 whereat 1906 through 1916 repeat forming additional layer(s) of the memory device.

Figure 20:
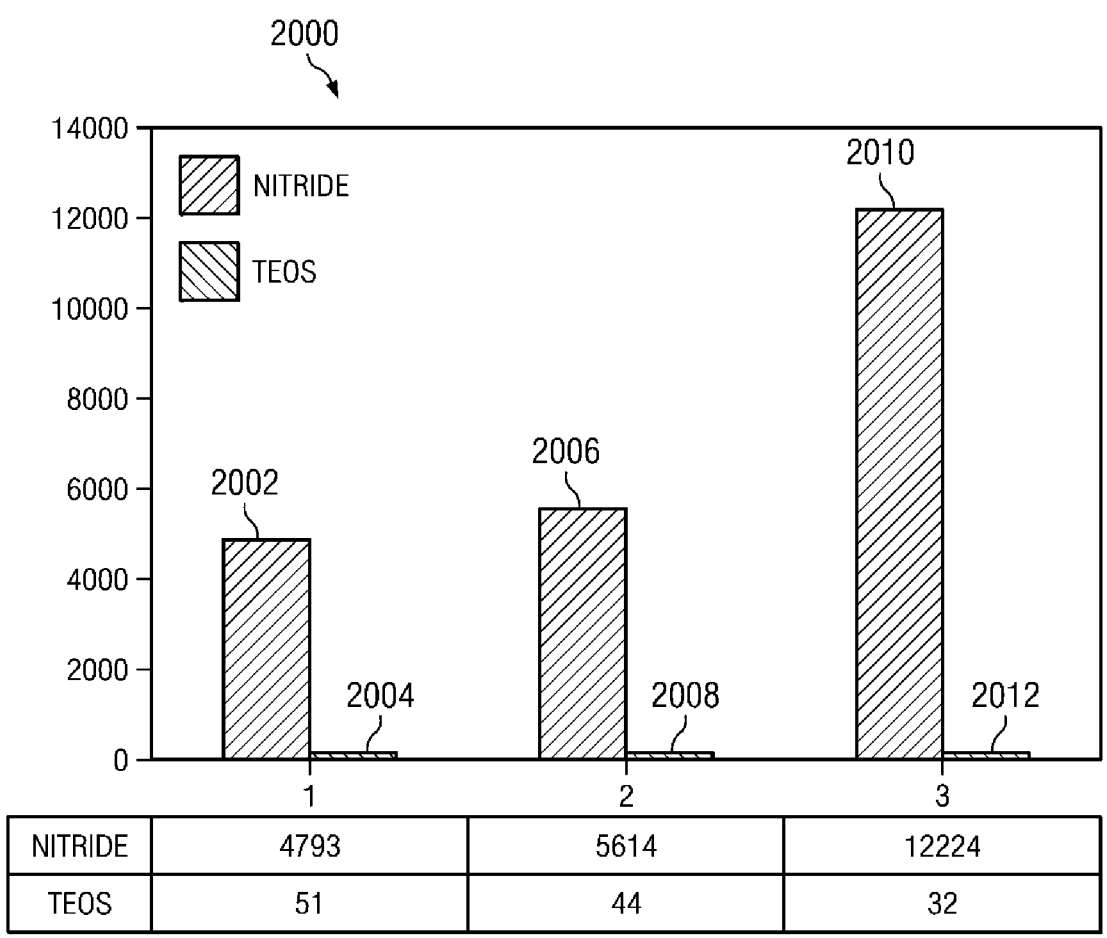
FIG. 20 is a bar graph comparing large particle contamination on nitride wafers vs. TEOS wafers, according to yet another aspect of the present invention.

FIG. 20 shows a graph 2000 that, in one embodiment of the invention, illustrates representative particle/contamination data that was obtained, comparing the difference in particles obtained on a nitride wafer vs. a TEOS (tetraethyl orthosilicate $Si(OC_2H_5)$) wafer. The graph illustrates three separate tests comparing the nitride wafer to the TEOS wafer after a polishing cycle and a clean cycle. The graph 2000 includes three different exemplary groupings of bar graphs 1, 2 and 3 corresponding to three separate tests, for example. For example, it can be seen in the first two bar graphs for test 1, that the number of large particles on the nitride wafer (2002) is 4793, whereas the number of large particles on the TEOS wafer (2004) is 51. The ratio of particles for the nitride wafer to the TEOS wafer for test 1 is 98 to 1. Also it is apparent that test 2 and test 3 indicate large nitride to TEOS particle ratios. Test 2 indicates a nitride (2006) to TEOS (2008) large particle ratio of 128 to 1 and test 3 shows a nitride (2010) to TEOS particle ratio of 384 to 1. As clearly illustrated the number of large particles that adhere to the nitride is much greater than the number of large particles that adhere to the oxide. This data indicates the advantage of coating the backside of the wafer with an oxide coating that is thick enough to withstand all of the various processes that remove the oxide coating during the fabrication of the memory device.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method for reducing wafer backside large particle contamination in the fabrication of an integrated circuit, comprising:
   (a) performing front end of line processing of a wafer to fabricate various devices on a front side of the wafer;
   (b) depositing a thick oxide on a backside of the wafer to a given thickness; and
   (c) performing back end of line processing of the wafer to establish electrical interconnections for the devices, the back end of line processing including multiple chemical mechanical polishing and cleaning steps applied to the front side of the wafer, the cleaning steps acting to etch both the front side and backside of the wafer, thereby causing reductions in the given thickness of the thick oxide;
   wherein the given thickness to which the thick oxide is deposited is equal to the sum of the reductions plus a predetermined remaining minimum thickness.

2. The method of claim 1, wherein the thick oxide is deposited on the wafer backside using techniques comprising vapor deposition.

3. The method of claim 1, wherein the front end of line processing comprises at least one of the following: forming shallow trench isolation, implanting a substrate, depositing an isolation pad oxide layer, depositing an isolation nitride layer, forming a photoresist layer, exposing photoresist, removing photoresist, etching the substrate, chemical mechanical polishing, chemical mechanical polishing cleaning, annealing, depositing and patterning a polysilicon gate, and depositing an antireflective coating.

4. The method of claim 1, wherein the back end of line processing comprises at least one of the following: chemical mechanical polishing, chemical mechanical polishing cleaning, depositing a cap oxide, performing a cap oxide etch, depositing a metal barrier layer, annealing, depositing a pre-metal dielectric liner, depositing a photoresist, depositing and forming metal contacts, depositing and patterning a inter-metallic dielectric, and depositing an antireflective coating.

5. The method of claim 1, wherein the cleaning steps comprise at least one of the following: chemical mechanical polishing cleaning, solvent bath cleans, wet chemical bath cleans, DIW scrubs, and chemical backside cleaning.

6. The method of claim 1, wherein the deposited thick oxide is a single deposition.

7. The method of claim 1, wherein the deposited thick oxide is more than one deposition.

8. The method of claim 1, wherein the deposited thick wafer backside oxide is at least one of the following: tetraethyl orthosilicate (TEOS), silicon dioxide (SiO2), zinc oxide (ZnO), aluminum oxide (AlO), nitrogen dioxide (NiO2), tin oxide (SnO2), and titanium dioxide (TiO2).

9. A method for reducing wafer large particle contamination in the fabrication of an integrated circuit; comprising:
   performing front end of line processing of a wafer;
   depositing a thick oxide film on a backside of the wafer to a thickness ($T_b$) that satisfies the formula:

$$T_b = r_i t_{Ti} + r_{i+1} t_{Ti+1} + \ldots + r_n t_{Tn} + k;$$

wherein $r_i$ is the etch rate for a cleaning process i; $t_{Ti}$ is the etch time for the cleaning process i; $r_{i+1}$ is the etch rate for a cleaning process i+1; $t_{Ti+1}$ is the etch time for the cleaning process i+1; $r_n$ is the etch rate for a cleaning process n; $t_{Tn}$ is the etch time for the cleaning process n; and k is a predetermined minimum thickness of the thick oxide film remaining at the end of back end of line processing; and
   performing back end of line processing of the wafer, including the i=0 to i=n cleaning processes.

10. The method of claim 9, wherein the front end of line processing comprises at least one of the following: forming shallow trench isolation, implanting a substrate, depositing an isolation pad oxide layer, depositing an isolation nitride layer, forming a photoresist layer, exposing photoresist, removing photoresist, etching the substrate, chemical mechanical polishing, chemical mechanical polishing cleaning, annealing, depositing and patterning a polysilicon gate, and depositing an antireflective coating.

11. The method of claim 9, wherein the back end of line processing comprises at least one of the following: chemical mechanical polishing, chemical mechanical polishing cleaning, depositing a cap oxide, performing a cap oxide etch, depositing a metal barrier layer, annealing, depositing a pre-metal dielectric liner, depositing a photoresist, depositing and forming metal contacts, depositing and patterning a inter-metallic dielectric, and depositing an antireflective coating.

12. The method of claim 9, wherein the cleaning processes i=0 to i=n comprise at least one of the following: chemical mechanical polishing cleaning, solvent bath cleans, wet chemical bath cleans, DIW scrubs, and chemical backside cleaning.

13. The method of claim 9, wherein the deposited thick oxide film comprises at least one of the following: tetraethyl orthosilicate (TEOS), silicon dioxide ($SiO_2$), zinc oxide (ZnO), aluminum oxide (AlO), nitrogen dioxide ($NiO_2$), tin oxide ($SnO_2$), and titanium dioxide ($TiO_2$).

14. A method for reducing large particle contamination in the fabrication of an integrated circuit, comprising:
   (a) performing front end of line processing of a wafer;
   (b) depositing a thick oxide film to a given thickness on a backside of the wafer;
   (c) depositing, patterning and etching inter-metallic dielectric (i) and photoresist (i);
   (d) removing photoresist (i) and forming metal contacts (i);
   (e) performing chemical mechanical polishing (i) and chemical mechanical polishing cleaning (i);

(f) depositing, patterning and etching inter-metallic dielectric (i+1) and photoresist (i+1);

(g) removing photoresist (i+1) and forming metal interconnects (i);

(h) performing chemical mechanical polishing (i+1) and chemical mechanical polishing cleaning (i+1); and (i) repeating steps (c)-(h) until contact and interconnect formation is completed wherein performing the chemical mechanical polishing cleanings (i) and (i+1) includes etching to cause reductions in the given thickness of the thick oxide film; and the depositing of the thick oxide film includes depositing the thick oxide film to the given thickness which is greater by a minimum amount than the total sum of the reductions.

15. The method of claim 14, wherein the deposited thick oxide film is at least one of the following: tetraethyl orthosilicate (TEOS), silicon dioxide (SiO2), zinc oxide (ZnO), aluminum oxide (AlO), nitrogen dioxide (NiO2), tin oxide (SnO2), and titanium dioxide (TiO2).

16. The method of claim 14, wherein the front end of line processing comprises at least one of the following: forming shallow trench isolation, implanting a substrate, depositing an isolation pad oxide layer, depositing an isolation nitride layer, forming a photoresist layer, exposing photoresist, removing photoresist, etching the substrate, chemical mechanical polishing, chemical mechanical polishing cleaning, annealing, depositing and patterning a polysilicon gate, and depositing an antireflective coating.

17. The method of claim 14, wherein depositing the thick oxide film comprises depositing the thick oxide film in a single deposition.

18. The method of claim 14, wherein depositing the thick oxide film comprises depositing the thick oxide film in more than one deposition.

* * * * *